United States Patent
Murakami et al.

(10) Patent No.: US 7,060,167 B2
(45) Date of Patent: Jun. 13, 2006

(54) VACUUM ARC VAPOR DEPOSITION APPARATUS

(75) Inventors: Yasuo Murakami, Ushiku (JP); Hiroshi Murakami, Kyoto (JP)

(73) Assignee: Nissin Electrci Co., LTD, Kyoto (JP)

( * ) Notice: Subject to any disclaimer, the term of this patent is extended or adjusted under 35 U.S.C. 154(b) by 205 days.

(21) Appl. No.: 10/726,655

(22) Filed: Dec. 4, 2003

(65) Prior Publication Data

US 2004/0124080 A1      Jul. 1, 2004

(30) Foreign Application Priority Data

Dec. 27, 2002   (JP) .............................. 2002-379709

(51) Int. Cl.
  *C23C 14/34*   (2006.01)
(52) U.S. Cl. .............................. 204/298.41; 204/192.38
(58) Field of Classification Search ........... 204/298.41, 204/192.38
  See application file for complete search history.

(56) References Cited

U.S. PATENT DOCUMENTS

| 4,448,799 | A | 5/1984 | Bergman et al. |
|---|---|---|---|
| 4,485,759 | A | 12/1984 | Brandolf |
| 5,441,624 | A | 8/1995 | Chan et al. |
| 5,840,163 | A | 11/1998 | Welty |
| 6,026,763 | A | 2/2000 | Kim et al. |
| 6,031,239 | A | 2/2000 | Shi et al. |
| 6,511,585 | B1 | 1/2003 | Shi et al. |
| 2002/0139662 | A1 | 10/2002 | Lee |

FOREIGN PATENT DOCUMENTS

| EP | 1 245 694 | 10/2002 |
|---|---|---|
| JP | 2001-011606 A1 | 1/2001 |
| JP | 2002-025794 A1 | 1/2002 |
| JP | 2002-294433 A1 | 10/2002 |
| WO | WO 96/26532 | 8/1996 |

OTHER PUBLICATIONS

Austrian Search and Examination Report for the Singapore Patent Application No. 200307001-8, mailed on Oct. 25, 2004.
Taiwan Patent Office Action dated Nov. 8, 2004.
European Search Report dated Dec. 15, 2005.
European Search Report, Application No.: 03029375.7-2119 PCT/, Oct. 19, 2005.
Taki et al., "Shielded Arc Ion Plating and Structural Characterization of amorphous carbon nitride thin films," pp. 183-190, Jul. 30, 1997.

(Continued)

*Primary Examiner*—Rodney G. McDonald
(74) *Attorney, Agent, or Firm*—Rader, Fishman & Grauer

(57) ABSTRACT

A vacuum arc vapor deposition apparatus can form a film of good quality without uselessly increasing a time from start of film deposition to completion thereof even when a trigger electrode induces vacuum arc discharge in response to turn-off of the vacuum arc discharge during deposition of the film onto the deposition target object. For example, the vacuum arc vapor deposition apparatus includes a shield member moved to and away from a position between a vapor source and a holder for supporting the deposition target object, a drive device for locating the shield plate selectively in a shield position between the vapor source and the holder, and a retracted position shifted from the shield position, a detector (e.g., current detector) detecting turn-on/off of the vacuum arc discharge, and a control portion controlling the drive device to locate the shield plate in the shield position when the detector detects turn-off of the vacuum arc discharge, and to locate the shield plate in the retracted position when a time required for stabilizing the vacuum arc discharge elapses after the detector detected turn-on of the vacuum arc discharge.

24 Claims, 4 Drawing Sheets

VACUUM ARC VAPOR DEPOSITION APPARATUS

CROSS-REFERENCE TO RELATED APPLICATION

This application is based on Japanese patent application No. 2002-379709 filed in Japan on Dec. 27, 2002, the entire content of which is hereby incorporated by reference.

BACKGROUND OF THE INVENTION

1. Field of the Invention

The present invention relates to a vacuum arc vapor deposition apparatus, which can be used for depositing thin films on objects or works such as automobile parts, machine parts, tools or dies for the purpose of improving at least one of wear resistance, sliding property, corrosion resistance and others.

2. Description of Related Art

According to a vacuum arc vapor deposition apparatus, vacuum arc discharge is caused between an anode and a cathode to vaporize a cathode material by the arc discharge, and plasma containing the ionized cathode material is produced to disperse the ionized cathode material onto a deposition target object or work so that a thin film is deposited on the deposition target object.

For generating the arc discharge between the anode and the cathode, a trigger electrode for inducing the arc discharge is opposed to a discharge surface of the cathode, and a voltage is applied across the cathode and the trigger electrode. Further, the trigger electrode is brought into contact with the discharge surface, and subsequently is spaced therefrom to cause the arc discharge so that the arc discharge is induced between the anode and the cathode.

The cathode and the trigger electrode, which is opposed to the cathode for inducing the arc discharge, are generally and collectively referred to as a vapor source.

According to such a vapor source, vacuum arc discharge is often interrupted during film deposition if the cathode is made of certain kinds of material (particularly, if the cathode is primarily made of carbon). Whenever the arc discharge is interrupted, the vacuum arc discharge is induced between the anode and the cathode by using the trigger electrode, which is provided for inducing the arc discharge, so that the film deposition is resumed.

However, the arc discharge is unstable when the vacuum arc discharge is induced between the anode and the cathode by the trigger electrode (this induction may be referred to as "arc ignition" hereinafter). Therefore, when the arc ignition is repeated for the film deposition, this lowers the film quality.

In the case where a cathode primarily made of, e.g., carbon is used for film deposition, the vacuum arc discharge is repetitively interrupted during the film deposition, and the arc ignition is performed every time such interruption occurs. Therefore, the deposited film has a large surface roughness.

In connection with this, Japanese Laid-Open Patent Publication No. 2002-25794 has proposed that a shield member is interposed between a vapor source and a deposition target object for shielding them from each other when arc ignition is performed.

However, it is necessary to deposit a film of good quality without uselessly increasing the time from start of deposition of a film having a predetermined thickness to completion of such film deposition. For satisfying the above, a shield member must be moved to and retracted from a position between the vapor source and the deposition target object in accordance with appropriate timing corresponding to interruption or turn-off of the vacuum arc discharge and the arc ignition. However, such moving and retracting operations are actually difficult.

SUMMARY OF THE INVENTION

Accordingly, an object of the invention is to provide a vacuum arc vapor deposition apparatus, in which a vapor source induces vacuum arc discharge between a cathode and an anode by using a trigger electrode opposed to the cathode, and a film is deposited on a deposition target object by using the vapor source, and particularly to provide a vacuum arc vapor deposition apparatus, which can form a film of good quality without uselessly increasing a time from start of the film deposition to completion thereof even when the trigger electrode induces the vacuum arc discharge in response to turn-off of the vacuum arc discharge during deposition of the film onto the deposition target object.

For achieving the above object, the invention provides the following two types of vacuum arc vapor deposition apparatus.

(1) First Vacuum arc Vapor Deposition Apparatus

A vacuum arc vapor deposition apparatus for depositing a film on a deposition target object by using a vapor source inducing vacuum arc discharge between a cathode and an anode by a trigger electrode opposed to the cathode, including:

a shield member moved to and away from a position between the vapor source and a holder for supporting the deposition target object;

a drive device for locating the shield member selectively in a shield position between the vapor source and the holder, and a retracted position shifted from the shield position;

a detector detecting turn-on/off of vacuum arc discharge of the vapor source; and a control portion controlling the drive device to locate the shield member in the shield position when the detector detects turn-off of the vacuum arc discharge, and to locate the shield member in the retracted position when a time required for stabilizing the vacuum arc discharge elapses after the detector detected turn-on of the vacuum arc discharge.

(2) Second Vacuum arc Vapor Deposition Apparatus

A vacuum arc vapor deposition apparatus for depositing a film on a deposition target object supported by a holder by using a vapor source inducing vacuum arc discharge between a cathode and an anode by a trigger electrode opposed to the cathode, including:

a magnetic filter having a solenoid coil for forming a magnetic field, and controlling dispersion of an ionized cathode material produced from the cathode by the vacuum arc discharge to move the ionized material toward the holder;

a power source device energizing the solenoid coil;

a detector detecting turn-on/off of vacuum arc discharge of the vapor source; and a control portion controlling the power source device to stop energizing of the solenoid coil when the detector detects the turn-off of the vacuum arc discharge, and to energize the solenoid coil when a time required for stabilizing the vacuum arc discharge elapses after the detector detected the turn-on of the vacuum arc discharge.

According to the first vacuum arc vapor deposition apparatus, when the detector detects the interruption or turn-off of the vacuum arc discharge, the shield member is located in the shield position between the vapor source and the holder supporting the deposition target object. When a time required for stabilizing the vacuum arc discharge elapses after the detector detected the turn-on of the vacuum arc discharge, the shield member is located in the retracted position shifted from the position between the vapor source and the holder.

Accordingly, even in such a case that the vacuum arc discharge is repetitively turned off during the film deposition, and the trigger electrode induces the vacuum arc discharge (i.e., it performs arc ignition) in response to every turn-off, the film deposition is resumed when the vacuum arc discharge becomes stable. Thus, the film deposition is resumed in such a state that the deposition target object is not subjected to or is hardly subjected to particles or the like, which are produced during the unstable state of the vacuum arc discharge, and adversely affect the film deposition process or the film quality. Therefore, the deposited film has good quality.

When the time required for stabilizing the vacuum arc discharge elapses after the detector detected the turn-on of the vacuum arc discharge, the shield member moves to the retracted position to resume the film deposition. Therefore, a uselessly long time is not required from the start of the film deposition to the completion thereof, which improves the efficiency of film deposition.

According to the second vacuum arc vapor deposition apparatus, when the detector detects the turn-off of the vacuum arc discharge, the solenoid coil is de-energized. When the time required for stabilizing the vacuum arc discharge elapses after the detector detected the turn-on of the vacuum arc discharge, the solenoid coil is energized again. While the solenoid coil is off, it is difficult to deflect the particles, which are produced by the vacuum arc discharge from the cathode, toward the holder supporting the deposition target object.

Accordingly, even in such a case that the vacuum arc discharge is repetitively turned off during the film deposition, and the trigger electrode induces the vacuum arc discharge (i.e., it performs arc ignition) in response to every turn-off, the film deposition is resumed when the vacuum arc discharge becomes stable. Thus, the film deposition is resumed in such a state that the deposition target object is not subjected to or is hardly subjected to particles or the like, which are produced during the unstable state of the vacuum arc discharge, and adversely affect the film deposition process or the film quality. Therefore, the deposited film has good quality.

When the time required for stabilizing the vacuum arc discharge elapses after the detector detected the turn-on of the vacuum arc discharge, the solenoid is re-energized. Therefore, a uselessly long time is not required from the start of the film deposition to the completion thereof, which improves the efficiency of film deposition.

Some kinds of conventional vacuum arc vapor deposition apparatuses have such a structure that a plurality of vapor sources are employed in one apparatus. For example, a plurality of vapor sources each employing a cathode material different from the others are used to form a film made of the different cathode materials. Also, a plurality of vapor sources are arranged along a length of a rod-like deposition target object for forming a uniform film throughout its length. In these cases, such a situation may occur that the vacuum arc discharge of one of the vapor sources is turned off, and then the arc ignition is performed to resume the film deposition before stabilization of the vacuum arc discharge. In this case, the deposited film does not have an intended film composition, or does not have uniformity in film thickness. The above situation becomes particularly remarkable when the vacuum arc discharge is frequently turned off.

Accordingly, the following third or fourth vacuum arc vapor deposition apparatuses may be employed as the apparatuses each employing a plurality of vapor sources.

(3) Third Vacuum arc Vapor Deposition Apparatus

A vacuum arc vapor deposition apparatus for depositing a film on a deposition target object by using a plurality of vapor sources inducing vacuum arc discharge between a cathode and an anode by a trigger electrode opposed to the cathode, including:

shield members provided for the plurality of vapor sources, respectively;

drive devices provided for the shield members, respectively;

detectors detecting turn-on/off of the vacuum arc discharge of the vapor sources, respectively; and a control portion, wherein each of the shield members is movable to and from a position between the corresponding vapor source and a holder supporting the deposition target object, and each of the drive devices locates the shield member selectively in a shield position between the vapor source and the holder, and a retracted position retracted from the shield position, and the control portion controls each of the drive devices to locate all the shield members in the shield position when at least one of the detectors detects the turn-off of the vacuum arc discharge, and to locate all the shield members in the retracted position when a time required for stabilizing all the vacuum arc discharges elapses after all the detectors detected the turn-on of the vacuum arc discharge.

In the above vacuum arc vapor deposition apparatus, a part of each of the drive device(s), a part of each of the detector(s) and/or the like may be common to the two or more vapor sources, unless a problem occurs.

In the first and/or third vacuum arc vapor deposition apparatuses, a magnetic filter having a solenoid coil for forming a magnetic field may be employed corresponding to at least one of the vapor sources for controlling an ionized cathode material produced from the cathode by the vacuum arc discharge to deflect the ionized material toward the holder. Also, a power source device energizing the solenoid coil may be employed.

In this case, the control portion may control the power source device(s) as follows. In this case, each power source device interrupts the energizing of the corresponding solenoid coil when at least one of the detector(s) detects the turn-off of the vacuum arc discharge, and energizes the solenoid coil upon elapsing of a time required for stabilizing all the vacuum arc discharge(s) after the detector(s) detected the turn-on of the vacuum arc discharge.

(4) Fourth Vacuum arc Vapor Deposition Apparatus

A vacuum arc vapor deposition apparatus for depositing a film on a deposition target object supported by a holder by using a plurality of vapor sources inducing vacuum arc discharge between a cathode and an anode by a trigger electrode opposed to the cathode, including:

magnetic filters arranged for the plurality of vapor sources, respectively;

power source devices for energizing the magnetic filters, respectively;

detectors detecting turn-on/off of the vacuum arc discharge of the vapor sources, respectively; and a control portion, wherein each of the magnetic filters has a solenoid coil to be energized by the power source device for forming a magnetic field, and the solenoid coil forms a magnetic field controlling dispersion of an ionized cathode material produced from the cathode by the vacuum arc discharge to move the ionized material toward the holder, and the control portion controls the power source devices to stop energizing of all the solenoid coils when at least one of the detectors detects the turn-off of the vacuum arc discharge, and to energize all the solenoid coils when a time required for stabilizing all the vacuum arc discharges elapses after all the detectors detected the turn-on of the vacuum arc discharge.

In the above vacuum arc vapor deposition apparatus, a part of each of the detectors, a part of each of the power source devices and/or the like may be common to the two or more vapor sources, unless a problem occurs.

In the first to fourth vacuum arc vapor deposition apparatuses, the detector and the control portion may typically have the following structures (a) and (b).

(a) The detector is a current detector detecting a discharge current based on the vacuum arc discharge. When the current detector does not detect a predetermined discharge current value, the control portion determines that the vacuum arc discharge is off. When the current detector detects the predetermined discharge current value, the control portion determines that the vacuum arc discharge is on.

(b) The detector is a voltage detector detecting a voltage applied to the cathode. When the voltage detector does not detect a predetermined voltage value, the control portion determines that the vacuum arc discharge is off. When the voltage detector detects the predetermined voltage value, the control portion determines that the vacuum arc discharge is on.

In the above structures (a) and (b), the predetermined discharge current value and the predetermined voltage value are a current value and a voltage value representing the turn-on of the vacuum arc discharge, respectively.

In the first to fourth vacuum arc vapor deposition apparatuses, the cathode may be primarily made of carbon, which frequently causes the turn-off of the vacuum arc discharge during film deposition.

If the cathode primarily made of carbon is employed, a time from one to three seconds or a time from one to two seconds may be set as the time required for stabilizing the vacuum arc discharge after detection of the turn-on of the vacuum arc discharge by the detector.

The time required for stabilizing the vacuum arc discharge after detection of the turn-on of the vacuum arc discharge by the detector may be determined in advance, e.g., from experiments depending on the material of the cathode, the vacuum arc vapor deposition apparatus to be used or the like. The time thus determined may be set in the control portion.

The vacuum arc vapor deposition apparatus may be provided with a time setting portion, through which an operator can set the time in the control portion, in view of such a case that the single vacuum arc vapor deposition apparatus is used for forming various kinds of films by selectively employing the cathodes of various materials.

According to the invention, as described above, the vacuum arc vapor deposition apparatus deposits the film on the deposition target object by using the vapor source(s) inducing vacuum arc discharge between the cathode and the anode by using the trigger electrode opposed to the cathode. Even in the case where the trigger electrode induces the vacuum arc discharge in response to the turn-off of the vacuum arc discharge during deposition of the film on the deposition target object, the vacuum arc vapor deposition apparatus according to the invention can form the film of good quality without uselessly increasing the time from start of the film deposition to the completion thereof.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the invention will now be described with reference to the drawings.

Figure 1:
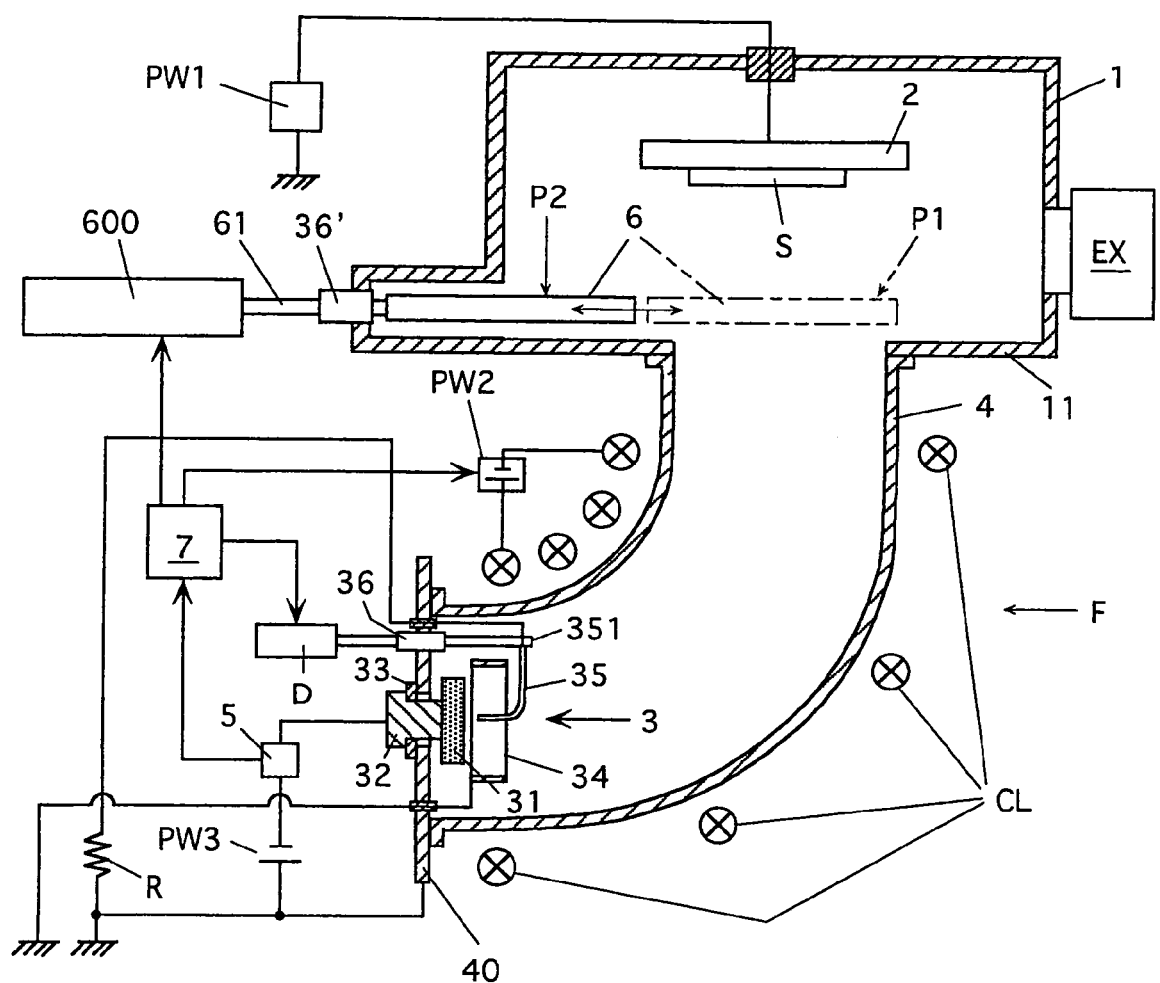
FIG. 1 shows a schematic structure of an example of a vacuum arc vapor deposition apparatus.

FIG. 1 shows a schematic structure of an example of a vacuum arc vapor deposition apparatus.

A vacuum arc vapor deposition apparatus shown in FIG. 1 includes a deposition container 1, in which a holder 2 is arranged for supporting a deposition target object S or work, which takes the form of a substrate in this embodiment. The holder 2 is connected to a power source PW1, which applies a bias voltage to the deposition target object S held by the holder 2 during the film deposition.

The container 1 is connected to an exhaust device EX, which can attain an intended vacuum state in the container 1. A vapor source 3 for vacuum arc vapor deposition is arranged at a container wall portion 11.

The vapor source 3 is connected to the container wall portion 11 via a curved pipe 4 having an arc-shaped form in a side view.

One end of the pipe 4 is connected to the container 1, and is opened toward the holder 2 in the container 1. The other end of the pipe 4 supports the vapor source 3.

A coil CL is arranged around the pipe 4 to form a solenoid coil, and is connected to a power source device PW2, which energizes the coil CL to form a magnetic field. The pipe 4 and the coil CL form a magnetic filter F, which operates when energized by the power source device PW2.

As already described, the vapor source 3 is arranged at the free end of the pipe 4. A wall plate 40, which is grounded, is attached to the free end of the pipe 4 for attaching a cathode 31 and others of the vapor source 3. An electrically conductive cathode support member 32 is fitted into a central aperture of the wall plate 40, and is fixed thereto by an insulating member 33.

The cathode 31 supported by the support member 32 is located within the pipe 4. The cathode 31 is made of an appropriate material corresponding to the film to be deposited, and is made of carbon in this embodiment.

Inside the wall plate 40, a cylindrical anode 34 is opposed to the cathode 31, and a rod-like trigger electrode 35 is located within the anode 34, and is opposed to a central portion of an end surface (i.e., discharge surface) of the cathode 31. The anode 34 is grounded.

The trigger electrode 35 extends through an opening of the anode 34 remote from the cathode 31, and then extends radially outward. A support rod 351 supports the radially outer portion of the trigger electrode 35. A so-called feed-through device 36 is arranged at the wall plate 40 for allowing reciprocation of the support rod 351 while sealing a space inside the wall plate 40. The support rod 351 extends through the feed-through device 36, and is connected to a linear-reciprocation drive device D. The device D can bring the trigger electrode 35 into contact with the cathode 31, and can be spaced therefrom.

The vapor source 3 also includes an arc power source PW3. The power source PW3 is connected to the cathode 31 and others via wiring for applying an arc discharge voltage across the cathode 31 and the anode 34, and for applying a trigger voltage across the cathode 31 and the trigger electrode 35 to induce the arc discharge between the cathode 31 and the anode 34. The trigger electrode 35 is grounded via a resistance R for preventing an arc current. A portion of the line between the arc power source PW3 and the cathode support member 32 is connected to a current detector 5 for detecting a discharge current based on the vacuum arc discharge.

A shield plate 6 is arranged for the opening of the pipe 4 near the deposition container 1. The shield plate 6 is arranged within the container 1, and is supported by a support rod 61. The support rod 61 is coupled to a linear-reciprocation drive device 600 outside the container through a so-called feed-through device 36' arranged at the container wall. The device 600 can move the shield plate 6 between a shield position P1 for covering the opening of the pipe 4 near the container (i.e., for shielding the holder 2 from the vapor source 3) and a retracted position P2 retracted from the shield position P1.

The vacuum arc vapor deposition apparatus further includes a control portion 7. The control portion 7 is connected to the current detector 5. When the detector 5 does not detect a predetermined discharge current value representing the turn-on of the vacuum arc discharge, the control portion 7 determines that the vacuum arc discharge is off. When the detector 5 detects the predetermined discharge current value, the control portion 7 determines that the vacuum arc discharge is on.

When the control portion 7 determines that the vacuum arc discharge is off, it controls the drive device 600 to move the shield plate 6 from the retracted position P2 to the shield position P1, and also controls the power source device PW2 to stop the energizing of the solenoid coil CL. Further, the control portion 7 controls the drive device D to move the trigger electrode 35 to a position inducing the vacuum arc discharge.

When the detector 5 detects the predetermined discharge current value representing the turn-on of the vacuum arc discharge, the control portion 7 determines that the vacuum arc discharge is on. When a predetermined time required for stabilizing the vacuum arc discharge elapses after the vacuum arc discharge was turned on, the control portion 7 controls the drive device 600 to move the shield plate 6 from the shield position P1 to the retracted position P2, and also controls the power source device PW2 of the magnetic filter F to energize the solenoid coil CL.

When the vacuum arc discharge is turned off, the detector 5 cannot detect the discharge current. When the vacuum arc discharge is on, the detector 5 can detect the discharge current. Based on this, the control portion 7 employs a current value providing a reference or criterion for determination of whether the vacuum arc discharge is on or off. When the detector 5 detects the current value equal to or larger than the reference current value, the control portion 7 determines that the vacuum arc discharge is on. Otherwise, the control portion 7 determines that the vacuum arc discharge is off.

According to the vacuum arc vapor deposition apparatus, which has been described with reference to FIG. 1, a thin carbon film can be deposited on the deposition target object S as follows.

First, the deposition target object S is located on the holder 2. Initially, the shield plate 6 is in the shield position P1, and the coil CL of the magnetic filter F is not energized. Then, the exhaust device EX operates to attain the deposition pressure in the container 1 and the pipe 4 connected thereto by exhausting a gas therefrom.

Also, the power source PW1 applies a bias voltage to the deposition target object S on the holder 2 for attracting ions for film deposition. Further, the power source PW3 applies a voltage to the cathode 31.

In this state, the trigger electrode 35 comes into contact with the cathode 31, and then is spaced therefrom. Thereby, sparks occur between the electrode 35 and the cathode 31, and triggers induction of the vacuum arc discharge between the anode 34 and cathode 31.

By this arc discharge, the carbon cathode 32 is heated so that evaporation of the carbon from the cathode starts. Also, plasma containing ionized carbon starts to be formed in front of the cathode 31.

In the above operation, the control portion 7 detects the turn-on of the vacuum arc discharge based on information provided from the current detector 5. Upon elapsing of the preset time required for stabilizing the vacuum arc discharge, the control portion 7 controls the drive device 600 to retract the shield plate 6 from the shield position P1 to the retracted position P2, and controls the power source device PW2 to energize the coil CL.

Thereby, the carbon ions are formed and deflected toward the deposition target object S on the holder 2 by the magnetic filter F so that the carbon ions reach the target object S carrying the bias voltage, and form the thin carbon film.

In this embodiment, since the carbon cathode 31 is employed, the vacuum arc discharge may be turned off during the film deposition. When turned off, the trigger electrode 35 performs the arc ignition.

When the current detector 5 detects the turn-off of the vacuum arc discharge, the control portion 7 operates to locate the shield plate 6 in the shield position P1 between the vapor source 3 and the deposition target object S, and to stop the energizing of the coil CL. When the time required for stabilizing the vacuum arc discharge elapses after the detector 5 detected the turn-on of the vacuum arc discharge caused by the arc ignition, the shield plate 6 is located in the retracted position P2, and the coil CL is energized.

Accordingly, even in the case where the vacuum arc discharge is repetitively interrupted or turned off during the film deposition, and the trigger electrode 35 performs the arc ignition in response to such interruption, the film deposition is resumed in the state where the vacuum arc discharge is stable. More specifically, the film deposition is resumed in the state where the deposition target object S is not subjected to or is hardly subjected to particles or the like, which are produced during the unstable state of the vacuum arc discharge, and adversely affect the film deposition process or the film quality. Therefore, the deposited film can have good quality.

When the time required for stabilizing the vacuum arc discharge elapses after the current detector 5 detected the turn-on of the vacuum arc discharge, the shield plate 6 rapidly moves to the retracted position P2, and the film deposition is resumed. Therefore, the time from the start of the film deposition to the completion thereof is not uselessly increased, and thus the film deposition can be performed efficiently. In the above manner, the deposition target object is coated with the carbon thin film. It is not essential to apply a bias voltage to the target object.

In the above example, the on/off control is effected on both the shield plate 6 and the energizing of the coil CL in connection with the turn-off of the vacuum arc discharge and the arc ignition. However, this on-off control may be effected on either the shield plate 6 or the energizing of the coil CL, which improves the efficiency, and can likewise achieve good quality of the films.

The magnetic filter F is not essential. However, the magnetic filter F can suppress dispersion of macro-particles of carbon, which may be produced by evaporation of the cathode 31, to the deposition target object S, and thereby can improve the quality of the produced carbon thin film.

The pipe 4 forming the filter F may be insulated from the container 1, the wall plate 40 and others so that negatively charged particles can be removed by applying a positive potential to the pipe 4.

Figure 2:
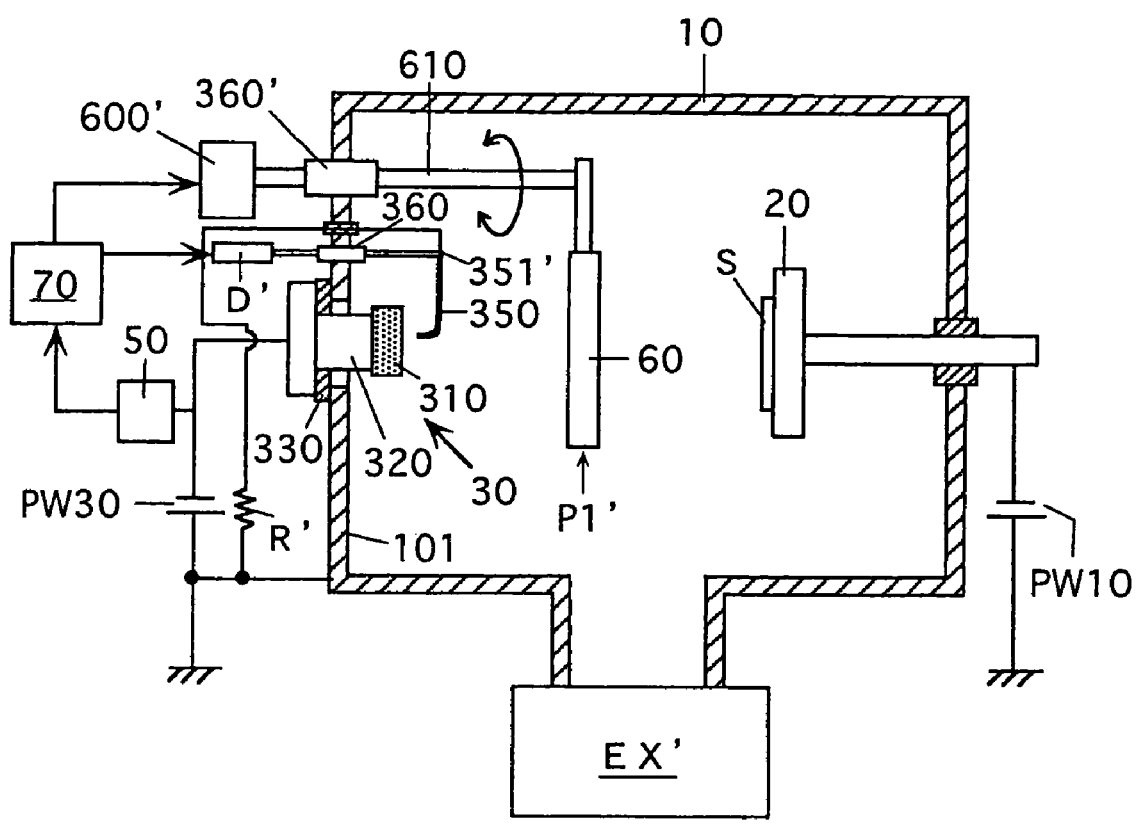
FIG. 2 shows a schematic structure of another example of a vacuum arc vapor deposition apparatus.

FIG. 2 shows another example of the vacuum arc vapor deposition apparatus.

The vacuum arc vapor deposition apparatus shown in FIG. 2 includes a deposition container 10, in which a holder 20 supporting the deposition target object S, which takes the form of a substrate in this embodiment, is arranged. The holder 20 is connected to a power source PW10, which applies a bias voltage to the deposition target object S supported on the holder during the deposition.

The container 10 is connected to an exhaust device EX', which can achieve an intended vacuum state in the container 10. A vapor source 30 for vacuum arc discharge is arranged at a container wall 101.

An electrically conductive cathode support member 320 is fitted into an aperture of the container wall 101, and is fixed thereto via an insulating material 330. A cathode 310 of the vapor source 30 is supported by the support member 320, and is located in the container 10. The cathode 310 may be made of a material selected depending on the film to be deposited, and is made of carbon in this example. The container 10 is grounded, and is used as an anode.

In the container 10, a rod-like trigger electrode 350 of the vapor source 30 is opposed to a central portion of an end surface (discharge surface) of the cathode 310. The trigger electrode 350 is supported by a support rod 351'. The support rod 351' is connected to a linear-reciprocation drive device D' through a feed-through device 360 arranged at the container wall 101. The device D' can move the trigger electrode 350 toward and away from the cathode 310.

The vapor source 30 is also includes an arc power source PW30, which is connected via wiring to the cathode 310 and others so that it can apply an arc discharge voltage across the cathode 310 and the container 10 (i.e., anode), and can induce the arc discharge between the cathode 310 and the container 10. The trigger electrode 350 is grounded via a resistance R1 for preventing flow of an arc current. The vapor source 30 is also provided with a voltage detector 50 for detecting the voltage applied to the cathode 310.

A shield plate 60 is arranged in a region between the vapor source 30 and the holder 20 within the container 10. The shield plate 60 is supported by a support rod 610. The rod 610 is connected to a reciprocation drive device 600' outside the container through a feed-through device 360' arranged at the container wall. The device 6001 turns the shield plate 60 to locate it selectively in a shield position P1' for shielding the holder 20 and the target object S thereon from the vapor source 30 and a retracted position retracted from the shield position P1'.

The vacuum arc vapor deposition apparatus further includes a control portion 70. The control portion 70 is connected to the voltage detector 50, and determines that the vacuum arc discharge is off when the detector 50 does not detect a predetermined voltage value representing that the vacuum arc discharge is on. When the detector 50 detects the predetermined voltage value, the control portion 70 determines that the vacuum arc discharge is on.

When the control portion 70 determines that the vacuum arc discharge is off, it controls the drive device 600' to move the shield plate 60 from the retracted position to the shield position P1'. Further, it controls the drive device D1 to move the trigger electrode 350 to a position inducing the vacuum arc discharge.

The control portion 70 determines that vacuum arc discharge is on when the voltage detector 50 detects the predetermined voltage value representing the turn-on of the vacuum arc discharge.

When the preset time required for stabilizing the vacuum arc discharge elapses after the turn-on of the vacuum arc discharge, the control portion 70 controls the drive device 600' to move the shield plate 60 from the shield position P1' to the retracted position.

When the vacuum arc discharge is turned off during the deposition, the detector 50 detects a rated voltage of the power source PW30 or a voltage close to it. During the turn-on of the vacuum arc discharge, the detector 50 detect a voltage value smaller than the value of the rated voltage or the voltage close to it. Based on this, a voltage value is set to provide a criterion of determination of whether the vacuum arc discharge is on or off, and the control portion 70 determines that the vacuum arc discharge is on when the voltage value not exceeding the criterion voltage value is detected. Otherwise, the control portion 70 determines that the vacuum arc discharge is off.

The vacuum arc vapor deposition apparatus, which has been described with reference to FIG. 2, can deposit a carbon thin film on the deposition target object S in the following manner.

First, the deposition target object S is laid on the holder 20. The shield plate 60 is initially in the shield position P1'.

Then, the exhaust device EX' operates to create an intended deposition pressure in the container 10.

The power source PW10 starts to apply the bias voltage for attracting the deposition ions to the deposition target object S on the holder 20, and the power source PW30 starts to apply a voltage to the cathode 310.

In this state, the trigger electrode 350 is brought into contact with the cathode 310, and then is spaced therefrom. Thereby, sparks occur between the electrode 350 and the cathode 310, and trigger the vacuum arc discharge between the container 10 (anode) and the cathode 310.

This arc discharge heats the carbon cathode 310 to evaporate carbon therefrom, and starts to form the plasma containing carbon ions in front of the cathode 310.

During the above operation, the control portion 70 detects the turn-on of the vacuum arc discharge from the information provided by the voltage detector 50, and will control the drive device 600' to retract the shield plate 60 from the shield position P1' to the retracted position when the preset time required for stabilizing the vacuum arc discharge elapses.

The carbon ions thus produced move onto the target object S carrying the bias voltage, and form the thin carbon film thereon.

Since this embodiment employs the carbon cathode 310, the vacuum arc discharge may be turned off during the film deposition. When turned off, the trigger electrode 350 performs the arc ignition.

In this case, when the voltage detector 50 detects the turn-off of the vacuum arc discharge, the shield plate 60 is located in the shield position P1' between the vapor source 30 and the deposition target object S under the control of the control portion 70. Then, the vacuum arc discharge is caused by the arc ignition, and is detected by the detector 50. When the time required for stabilizing the vacuum arc discharge elapses, the shield plate 60 is located in the retracted position.

Accordingly, even if the vacuum arc discharge is repetitively turned off during the film deposition, and the trigger electrode 350 performs the arc ignition in response to every turn-off, the film deposition is resumed in the state where the vacuum arc discharge is stable, and thus in the state where the deposition target object S is not subjected to or is hardly subjected to particles or the like, which are produced during the unstable state of the vacuum arc discharge, and adversely affect the film deposition process or the film quality. Therefore, the deposited film can have good quality.

When the time required for stabilizing the vacuum arc discharge elapses after the voltage detector 50 detected the turn-on of the vacuum arc discharge, the shield plate 60 rapidly moves to the retracted position, and the film deposition is resumed. Therefore, the time from the start of film deposition to the completion thereof does not uselessly increase, and thus the film deception can be performed efficiently. In this manner, the target object can be coated with the carbon thin film. The application of the bias voltage to the target object is not essential.

Figure 3:
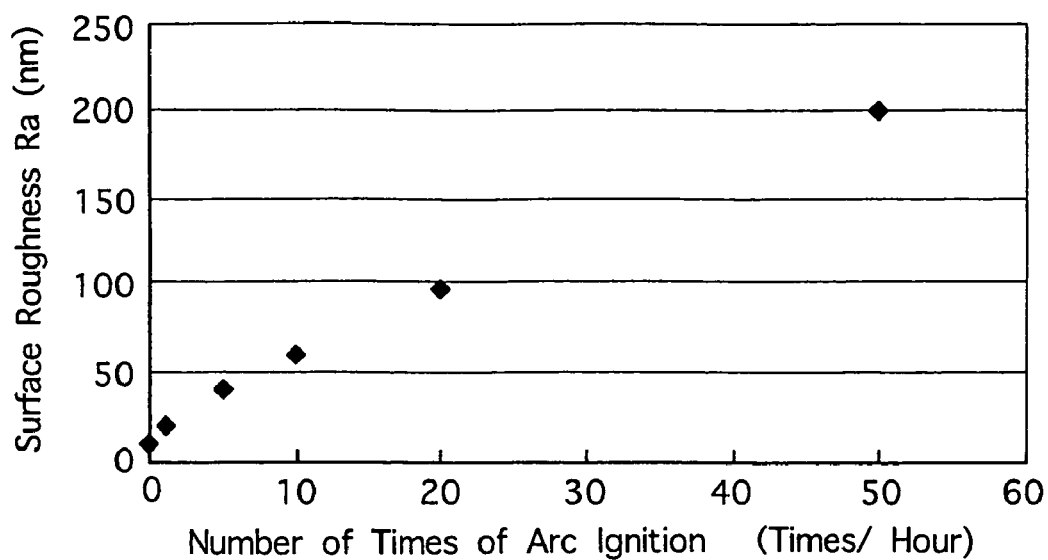
FIG. 3 illustrates a relationship between times of arc ignition and surface roughness of deposited films obtained by experiments of film deposition by a vacuum arc vapor deposition apparatus not employing a shield plate.
Figure 4:
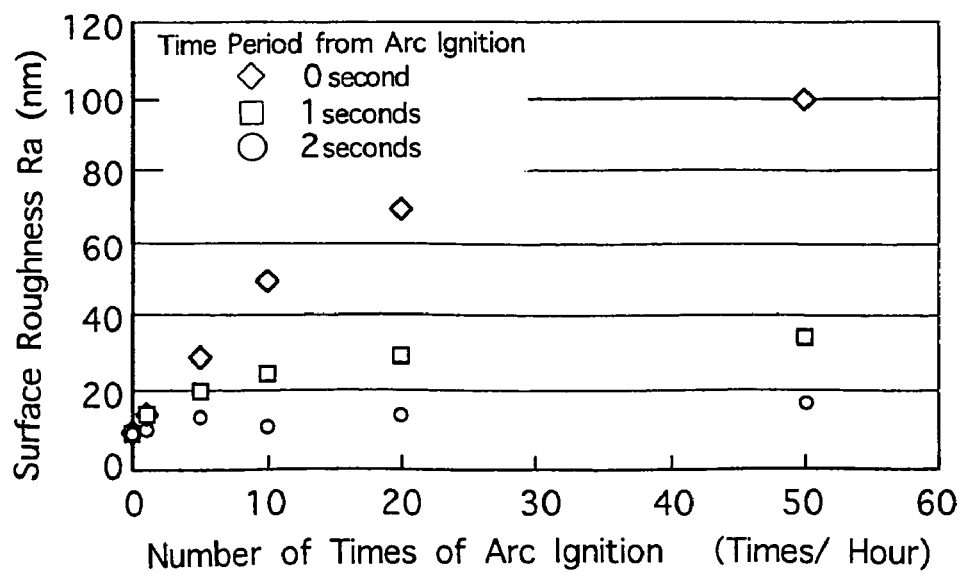
FIG. 4 illustrates a relationship between times of arc ignition and surface roughness of deposited films obtained by experiments of film deposition by a vacuum arc vapor deposition apparatus employing the shield plate.

FIGS. 3 and 4 illustrate results of experiments, in which carbon films of 0.5 μm in thickness were formed on silicon substrates by a vacuum arc vapor deposition apparatus of the type shown in FIG. 2, and particularly illustrate relationships between the times (number of times) of arc ignition during the deposition and surface roughness of the deposited carbon films.

FIG. 3 illustrates cases where a shield plate was not employed. FIG. 4 illustrates cases where a shield plate was employed, and the time periods from the arc ignition to the retraction of the shield plate were set to 0, 1 and 2 seconds, respectively.

As can be seen from FIG. 3, when the shield plate is not employed, the surface roughness of the deposited carbon film remarkably increases with increase in times of the arc ignition, and therefore, the quality of the carbon film decreases. As can be seen from FIG. 4, when the shield plate is employed, the surface roughness of the deposited carbon film increases only to a small extent with increase in times of the arc ignition. Therefore, the film of good quality can be deposited. Further, as compared with the case where the shield plate is retracted immediately after the turn-on of the arc ignition, the surface roughness of the deposited carbon film increases to a lesser extent with increase in times of the arc ignition in the case where the shield plate is retracted after one or two seconds from the turn-on of the arc ignition. Thereby, the deposited film can have further improved quality.

Figure 5:
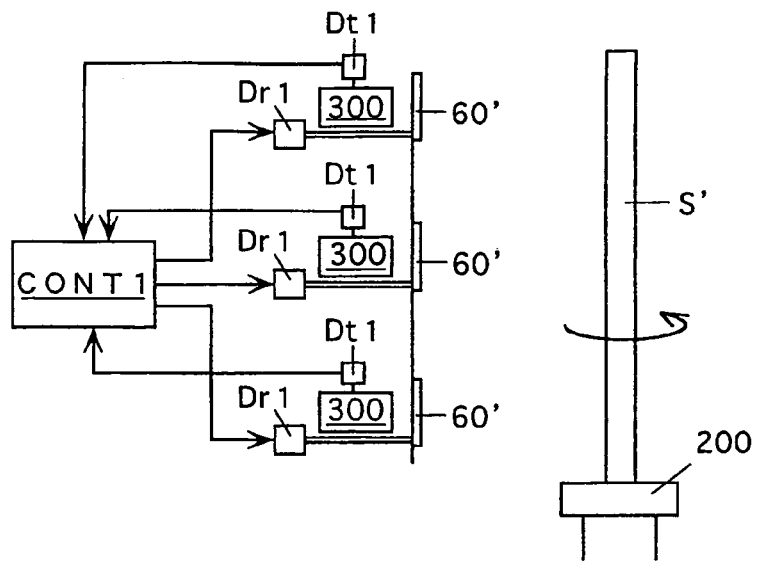
FIG. 5 shows an arrangement of major portions of an example of a vacuum arc vapor deposition apparatus provided with a plurality of vapor sources.
Figure 6:
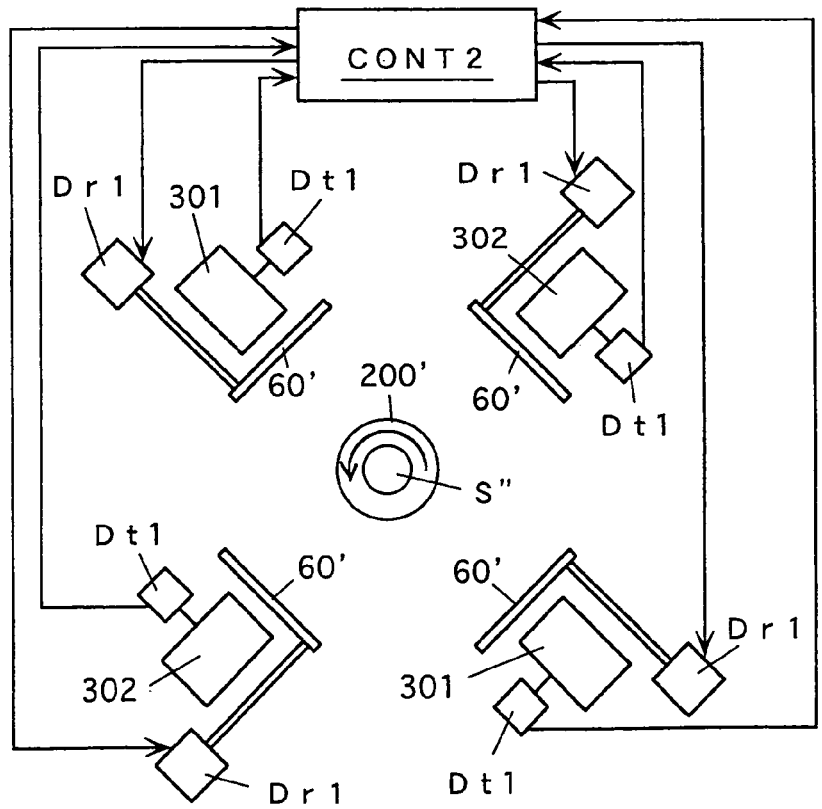
FIG. 6 shows an arrangement of major portions of another example of a vacuum arc vapor deposition apparatus provided with a plurality of vapor sources.

The vacuum arc vapor deposition apparatus described above includes only one vapor source. However, two or more vapor sources may be employed. FIGS. 5 and 6 show arrangements of major portions of apparatuses each including a plurality of vapor sources.

The apparatus shown in FIG. 5 is configured to form a uniform carbon film on a long rod-like deposition target object S' held in a vertical position by a holder 200, which is rotated by a drive unit (not shown). A vapor source 300 similar to the vapor source 30 shown in FIG. 2 is arranged in each of vertically spaced several stages, and is directed toward the deposition target object S' on the holder 200. The vapor sources 300 thus arranged can form the carbon film of a uniform thickness on the entire surface of the deposition target object S'.

A shield member 60' can be moved to and from a position between each vapor source 300 and the holder 200. The apparatus also includes detectors (current or voltage detectors) Dt1 for detecting turn-on/off of the vacuum arc discharge of the respective vapor sources 300 as well as a control portion CONT1 controlling the positions of the shield members and the arc ignition.

Each shield member 60' can be moved by a drive device Dr1 from the shield position between the vapor source and the holder to the retracted position shifted from the shield position, and vice versa.

When at least one of the detectors Dt1 detects the turn-off of the vacuum arc discharge, the control portion CONT1 controls the respective drive devices Dr1 to locate all the shield members 60' in the shield position, and to retract thereafter the respective shield members 60' when the time required for stabilizing all the vacuum arc discharges elapses after all the detectors Dt1 detected the turn-on of the vacuum arc discharge.

The apparatus in FIG. 6 is configured to deposit a film of a uniform composition, which includes aluminum and titanium, on a deposition target object S'' held on a holder 200' rotated by a drive unit (not shown) Two vapor sources 301 each having an aluminum cathode and two vapor sources 302 each having a titanium cathode are alternately arranged around the holder 200'.

A shield member 60' can be moved to and from a position between each vapor source and the holder 200'. The apparatus also includes the detectors (current or voltage detectors) Dt1 for detecting turn-on/off of the vacuum arc discharge of the respective vapor sources as well as a control portion CONT2 controlling the positions of the shield members and the arc ignition.

Each shield member 60' can be moved by the drive device Dr1 from the shield position between the vapor source and the holder to the retracted position shifted from the shield position, and vice versa.

When at least one of the detectors Dt1 detects the turn-off of the vacuum arc discharge, the control portion CONT2 controls the respective drive devices Dr1 to locate all the shield members 60' in the shield position, and to retract thereafter the respective shield members 60' when the time required for stabilizing all the vacuum arc discharges elapses after all the detectors Dt1 detected the turn-on of the vacuum arc discharge.

According to the apparatus shown in FIGS. 5 and 6, the time required for stabilizing all the vacuum arc discharge after all the detectors detected the turn-on of the vacuum arc discharge is usually equal to the time required for stabilizing the vacuum arc discharge of the vapor source, which performed the last vacuum arc discharge, after the corresponding detector detected this last vacuum arc discharge. However, the time required for stabilizing the last second discharge of the vapor source preceding the turn-on of the last discharge may be longer than that for stabilizing of the last discharge. In this case, the foregoing time required for stabilizing all the vacuum arc discharge after all the detectors detected the turn-on of the vacuum arc discharge is equal to the time required for stabilizing the last second discharge.

In the vacuum arc vapor deposition apparatus having a plurality of vapor sources, the magnetic filter may be employed for at least one vapor source, as is done in the apparatus shown in FIG. 1. In this case, the on/off of the magnetic filter may be controlled instead of the position control of the shield member, similarly to the apparatus in FIG. 1. Also, both the position control of the shield member and the on/off control of the magnetic filter may be performed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A vacuum arc vapor deposition apparatus for depositing a film on a deposition target object by using a vapor source inducing vacuum arc discharge between a cathode and an anode by a trigger electrode opposed to the cathode, comprising:

a shield member moved to and away from a position between said vapor source and a holder for supporting the deposition target object;

a drive device for locating said shield member selectively in a shield position between said vapor source and the holder, and a retracted position shifted from said shield position;

a detector detecting turn-on/off of vacuum arc discharge of said vapor source; and a control portion controlling said drive device to locate said shield member in said shield position when said detector detects turn-off of the vacuum arc discharge, and to locate said shield member in said retracted position when a time required for stabilizing vacuum arc discharge elapses after said detector detected turn-on of the vacuum arc discharge.

2. The vacuum arc vapor deposition apparatus according to claim 1, further comprising:

a magnetic filter provided for said vapor source, and having a solenoid coil for forming a magnetic field controlling an ionized cathode material produced from said cathode by the vacuum arc discharge to deflect said ionized material toward said holder; and a power source device energizing said solenoid coil.

3. The vacuum arc vapor deposition apparatus according to claim 2, wherein
said control portion controls said power source device such that said power source device interrupts the energizing of said solenoid coil when said detector detects the turn-off of the vacuum arc discharge, and energizes said solenoid coil upon elapsing of a time required for stabilizing the vacuum arc discharge after said detector detected the turn-on of the vacuum arc discharge.

4. The vacuum arc vapor deposition apparatus according to claim 1, wherein
said detector is a current detector detecting a discharge current based on the vacuum arc discharge, said control portion determines that the vacuum arc discharge is off when said current detector does not detect a predetermined discharge current value, and said control portion determines that the vacuum arc discharge is on when said current detector detects said predetermined discharge current value.

5. The vacuum arc vapor deposition apparatus according to claim 1, wherein
said detector is a voltage detector detecting a voltage applied to said cathode, said control portion determines that the vacuum arc discharge is off when said voltage detector does not detect a predetermined discharge voltage value, and said control portion determines that the vacuum arc discharge is on when said voltage detector detects said predetermined discharge voltage value.

6. The vacuum arc vapor deposition apparatus according to claim 1, wherein
said cathode is primarily made of carbon.

7. The vacuum arc vapor deposition apparatus according to claim 1, wherein
said cathode is primarily made of carbon, and said control portion sets, for the vapor source having the cathode primarily made of carbon, a time from one to three seconds as the time required for stabilizing the vacuum arc discharge after detection of the turn-on of the vacuum arc discharge by said detector.

8. A vacuum arc vapor deposition apparatus for depositing a film on a deposition target object by using a plurality of vapor sources inducing vacuum arc discharge between a cathode and an anode by a trigger electrode opposed to the cathode, comprising:

shield members provided for said plurality of vapor sources, respectively;

drive devices provided for said shield members, respectively;

at least one detector detecting turn-on/off of the vacuum arc discharge of the vapor sources, respectively; and a control portion, wherein each of said shield members is movable to and from a position between the corresponding vapor source and a holder supporting the deposition target object, and each of said drive devices locates said shield member selectively in a shield position between said vapor source and the holder, and a retracted position retracted from said shield position, and said control portion controls each of said drive devices to locate all of said shield members in said shield position when said at least one detector detects the turn-off of the vacuum arc discharge, and to locate all of said shield members in said retracted position when a time required for stabilizing all the vacuum arc discharges elapses after said at least one detector detected the turn-on of the vacuum arc discharge.

9. The vacuum arc vapor deposition apparatus according to claim 8, further comprising:
a magnetic filter provided for at least one of said vapor sources, and having a solenoid coil for forming a magnetic field controlling an ionized cathode material produced from said cathode by the vacuum arc discharge to deflect said ionized material toward said holder; and at least one power source device energizing said solenoid coil.

10. .The vacuum arc vapor deposition apparatus according to claim 9, wherein
said control portion controls said at least one power source device such that said at least one power source device interrupts the energizing of said solenoid coil when said at least one detector detects the turn-off of the vacuum arc discharge, and energizes said solenoid coil upon elapsing of a time required for stabilizing all the vacuum arc discharges after at least one detector detected the turn-on of the vacuum arc discharge.

11. The vacuum arc vapor deposition apparatus according to claim 8, wherein
said at least one detector is a current detector detecting a discharge current based on the vacuum arc discharge, said control portion determines that the vacuum arc discharge is off when said current detector does not detect a predetermined discharge current value, and said control portion determines that the vacuum arc discharge is on when said current detector detects said predetermined discharge current value.

12. The vacuum arc vapor deposition apparatus according to claim 8, wherein
said at least one detector is a voltage detector detecting a voltage applied to said cathode, said control portion determines that the vacuum arc discharge is off when said voltage detector does not detect a predetermined discharge voltage value, and said control portion determines that the vacuum arc discharge is on when said voltage detector detects said predetermined discharge voltage value.

13. The vacuum arc vapor deposition apparatus according to claim 8, wherein
said cathode is primarily made of carbon.

14. The vacuum arc vapor deposition apparatus according to claim 8, wherein
said cathode is primarily made of carbon, and said control portion sets, for each of the vapor sources having the cathode primarily made of carbon, a time from one to three seconds as the time required for stabilizing the vacuum arc discharge after detection of the turn-on of the vacuum arc discharge by said detector.

15. A vacuum arc vapor deposition apparatus for depositing a film on a deposition target object supported by a holder by using a vapor source inducing vacuum arc discharge between a cathode and an anode by a trigger electrode opposed to the cathode, comprising:
a magnetic filter having a solenoid coil for forming a magnetic field, and controlling dispersion of an ionized cathode material produced from said cathode by the vacuum arc discharge to move the ionized material toward said holder;
a power source device energizing said solenoid coil;
a detector detecting turn-on/off of vacuum arc discharge of said vapor source; and
a control portion controlling said power source device to stop energizing of said solenoid coil when said detector detects the turn-off of the vacuum arc discharge, and to energize said solenoid coil when a time required for stabilizing the vacuum arc discharge elapses after the detector detected the turn-on of the vacuum arc discharge.

16. The vacuum arc vapor deposition apparatus according to claim 15, wherein
said detector is a current detector detecting a discharge current based on the vacuum arc discharge, said control portion determines that the vacuum arc discharge is off when said current detector does not detect a predetermined discharge current value, and said control portion determines that the vacuum arc discharge is on when said current detector detects said predetermined discharge current value.

17. The vacuum arc vapor deposition apparatus according to claim 15, wherein
said detector is a voltage detector detecting a voltage applied to said cathode, said control portion determines that the vacuum arc discharge is off when said voltage detector does not detect a predetermined discharge voltage value, and said control portion determines that the vacuum arc discharge is on when said voltage detector detects said predetermined discharge voltage value.

18. The vacuum arc vapor deposition apparatus according to claim 15, wherein
said cathode is primarily made of carbon.

19. The vacuum arc vapor deposition apparatus according to claim 15, wherein
said cathode is primarily made of carbon, and said control portion sets, for the vapor source having the cathode primarily made of carbon, a time from one to three seconds as the time required for stabilizing the vacuum arc discharge after detection of the turn-on of the vacuum arc discharge by said detector.

20. A vacuum arc vapor deposition apparatus for depositing a film on a deposition target object supported by a holder by using a plurality of vapor sources inducing vacuum arc discharge between a cathode and an anode by a trigger electrode opposed to the cathode, comprising:
magnetic filters arranged for said plurality of vapor sources, respectively;
at least one power source device for energizing said magnetic filters, respectively;
at least one detector detecting turn-on/off of the vacuum arc discharge of said vapor sources, respectively; and
a control portion, wherein
each of said magnetic filters has a solenoid coil to be energized by said at least one power source device for forming a magnetic field, and said solenoid coil forms a magnetic field controlling dispersion of an ionized cathode material produced from said cathode by the vacuum arc discharge to move the ionized material toward said holder, and
said control portion controls said at least one power source device to stop energizing of all of said solenoid coils when said at least one detector detects the turn-off of the vacuum arc discharge, and to energize all of said solenoid coils when a time required for stabilizing all of said vacuum arc discharges elapses after said at least one detector detected the turn-on of the vacuum arc discharge.

21. The vacuum arc vapor deposition apparatus according to claim 20, wherein said at least one detector is a current detector detecting a discharge current based on the vacuum arc discharge, said control portion determines that the vacuum arc discharge is off when said current detector does not detect a predetermined discharge current value, and said control portion determines that the vacuum arc discharge is on when said current detector detects said predetermined discharge current value.

22. The vacuum arc vapor deposition apparatus according to claim 20, wherein said at least one detector is a voltage detector detecting a voltage applied to said cathode, said control portion determines that the vacuum arc discharge is off when said voltage detector does not detect a predetermined discharge voltage value, and said control portion determines that the vacuum arc discharge is on when said voltage detector detects said predetermined discharge voltage value.

23. The vacuum arc vapor deposition apparatus according to claim 20, wherein cathode is primarily made of carbon.

24. The vacuum arc vapor deposition apparatus according to claim 20, wherein said cathode is primarily made of carbon, and said control portion sets, for each of the vapor sources having the cathode primarily made of carbon, a time from one to three seconds as the time required for stabilizing the vacuum arc discharge after detection of the turn-on of the vacuum arc discharge by said detector.

* * * * *